United States Patent
Matsui

(10) Patent No.: US 9,374,040 B2
(45) Date of Patent: Jun. 21, 2016

(54) POWER AMPLIFYING MODULE

(71) Applicant: Murata Manufacturing Co., Ltd., Kyoto (JP)

(72) Inventor: Toshiki Matsui, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/561,414

(22) Filed: Dec. 5, 2014

(65) Prior Publication Data

US 2015/0171796 A1    Jun. 18, 2015

(30) Foreign Application Priority Data

Dec. 12, 2013   (JP) .................................. 2013-257376

(51) Int. Cl.

| | | |
|---|---|---|
| H03F 1/22 | (2006.01) | |
| H03F 1/02 | (2006.01) | |
| H03F 3/19 | (2006.01) | |
| H03F 1/32 | (2006.01) | |
| H03F 1/56 | (2006.01) | |
| H03F 3/21 | (2006.01) | |
| H03F 3/24 | (2006.01) | |

(52) U.S. Cl.
CPC ............ *H03F 1/0222* (2013.01); *H03F 1/3223* (2013.01); *H03F 1/56* (2013.01); *H03F 3/19* (2013.01); *H03F 3/211* (2013.01); *H03F 3/24* (2013.01); *H03F 2200/111* (2013.01); *H03F 2200/222* (2013.01); *H03F 2200/318* (2013.01); *H03F 2200/387* (2013.01); *H03F 2200/411* (2013.01); *H03F 2200/429* (2013.01); *H03F 2200/451* (2013.01); *H03F 2200/504* (2013.01)

(58) Field of Classification Search
CPC ............ H03F 1/22; H03F 1/223; H03F 1/226
USPC .................................................. 330/136, 311
See application file for complete search history.

(56) References Cited

U.S. PATENT DOCUMENTS

| | | | |
|---|---|---|---|
| 2002/0079971 A1* | 6/2002 | Vathulya | ................. H03F 1/223 330/311 |
| 2011/0070848 A1 | 3/2011 | Ramachandra Reddy | |

FOREIGN PATENT DOCUMENTS

| | | | |
|---|---|---|---|
| JP | 03-276912 | A | 12/1991 |
| JP | 2005-176331 | A | 6/2005 |
| JP | 2008-047978 | A | 2/2008 |
| JP | 2009-010826 | A | 1/2009 |

* cited by examiner

*Primary Examiner* — Steven J Mottola
(74) *Attorney, Agent, or Firm* — Pearne & Gordon LLP

(57) ABSTRACT

The linearity of a power amplifying module employing an envelope tracking scheme is improved. The power amplifying module includes a first bipolar transistor having a base to which a first radio frequency signal is input and an emitter grounded, and a second bipolar transistor having a base to which a first constant voltage is applied, a collector to which a first power supply voltage is applied, the first power supply voltage adapted to vary in accordance with an amplitude of the first radio frequency signal, and an emitter connected to a collector of the first bipolar transistor. The second bipolar transistor is configured to output a first amplified signal, obtained by amplifying the first radio frequency signal, from the collector of the second bipolar transistor.

9 Claims, 10 Drawing Sheets

POWER AMPLIFYING MODULE

BACKGROUND OF THE INVENTION

1. Field of the Invention

The present invention relates to a power amplifying module.

2. Background Art

In a power amplifying module that amplifies a radio frequency (RF) signal, a base-collector parasitic capacitance of an amplifying transistor may affect the frequency characteristics of the module. In view of this, for example, Patent Document 1 proposes a configuration that improves the frequency characteristics by providing an inductor in parallel with such a base-collector parasitic capacitance.

In addition, a power amplifying module is required to reduce its power consumption. In view of this, for example, Patent Document 2 discloses a configuration that improves the power efficiency by controlling a power supply voltage of a power amplifying module in accordance with an amplitude level of an input signal, which is a so-called envelope tracking scheme.

CITATION LIST

Patent Documents

[Patent Document 1] JP2005-176331 A
[Patent Document 2] JP H03-276912 A

As disclosed in Patent Document 1, the frequency characteristics can be improved by providing the inductor in parallel with the base-collector parasitic capacitance. On the other hand, according to the envelope tracking scheme disclosed in Patent Document 2, however, a gain variation attributed to a power supply voltage arises as a problem. Specifically, according to the envelope tracking scheme, a base-collector capacitance of an amplifying transistor varies in accordance with a power supply voltage and this variation in base-collector capacitance may cause a variation in the gain of a power amplifying module, resulting in a degradation of its linearity.

SUMMARY OF THE INVENTION

The present invention has been made in view of such circumstances and may improve the linearity of a power amplifying module employing an envelope tracking scheme.

A power amplifying module according to one aspect of the present invention includes a first bipolar transistor having a base to which a first radio frequency signal is input and an emitter grounded, and a second bipolar transistor having a base to which a first constant voltage is applied, a collector to which a first power supply voltage is applied, the first power supply voltage adapted to vary in accordance with an amplitude of the first radio frequency signal, and an emitter connected to a collector of the first bipolar transistor, the second bipolar transistor configured to output a first amplified signal, obtained by amplifying the first radio frequency signal, from the collector of the second bipolar transistor.

According to the present invention, it is possible to improve the linearity of a power amplifying module employing an envelope tracking scheme.

DESCRIPTION OF THE PREFERRED EMBODIMENTS

Figure 1:
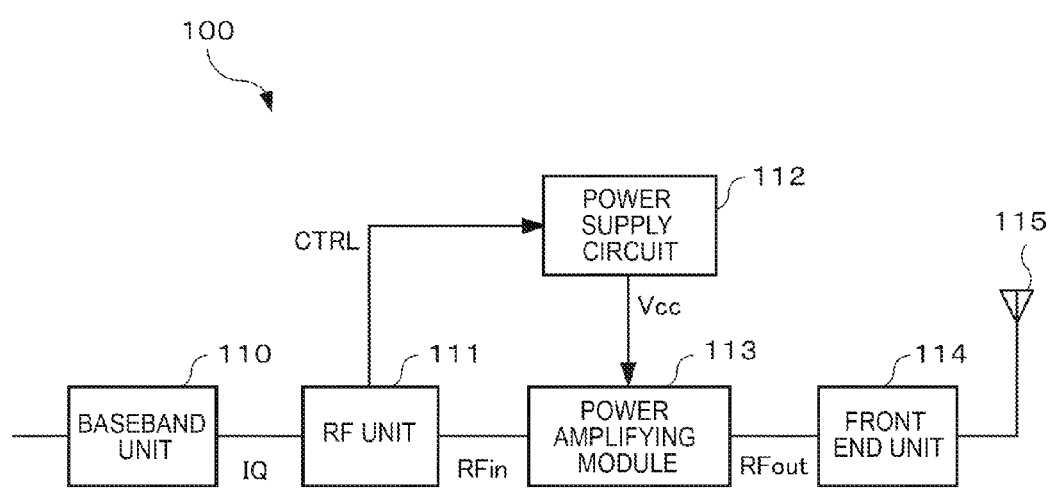
FIG. 1 is a diagram showing an example of a configuration of a transmission unit including a power amplifying module according to a preferred embodiment of the present invention.

Hereinbelow, a preferred embodiment of the present invention will be described with reference to the drawings. FIG. 1 is a diagram showing an example of a configuration of a transmission unit including a power amplifying module according to the preferred embodiment of the present invention. For example, in a mobile communication device such as a cellular phone, a transmission unit 100 is used to transmit various signals such as sound and data to a base station. In this preferred embodiment, the transmission unit 100 is compatible with a plurality of radio frequency (RF) bands. Although the mobile communication device also includes a reception unit configured to receive signals from the base station, a description thereof will be omitted herein.

As shown in FIG. 1, the transmission unit 100 includes a baseband unit 110, an RF unit 111, a power supply circuit 112, a power amplifying module 113, a front end unit 114, and an antenna 115.

The baseband unit 110 modulates an input signal such as sound or data based on a modulation scheme such as High Speed Uplink Packet Access (HSUPA) or Long Term Evolution (LTE) and outputs a modulated signal. In this preferred embodiment, the modulated signal is output from the baseband unit 110 as an IQ signal (I signal and Q signal) whose amplitudes and phases are plotted on an IQ plane. The frequency of the IQ signal ranges from about several MHz to about tens of MHz, for example.

The RF unit 111 produces an RF signal (RFin) for wireless transmission from the IQ signal output from the baseband unit 110. The frequency of the RF signal ranges from about several hundred MHz to about several GHz, for example. In addition, the RF unit 111 detects an amplitude level of the modulated signal based on the IQ signal and outputs a power supply control signal CTRL to the power supply circuit 112 so that a power supply voltage Vcc which is supplied to the power amplifying module 113 is controlled to a level corresponding to an amplitude level of the RF signal. In other words, the RF unit 111 outputs a power supply control signal CTRL shown in FIG. 2, thereby enabling envelope tracking.

Instead of directly converting an IQ signal into an RF signal, the RF unit 111 may first convert an IQ signal into an intermediate frequency (IF) signal and then produce an RF signal from the IF signal.

As shown in FIG. 1, the power supply circuit 112 generates a power supply voltage Vcc at a level corresponding to a power supply control signal CTRL output from the RF unit 111 and supplies it to the power amplifying module 113. For example, the power supply circuit 112 can include a DC-DC converter configured to generate a power supply voltage Vcc at a level corresponding to a power supply control signal CTRL from an input voltage such as a battery voltage.

The power amplifying module 113 amplifies the power of an RF signal (RFin), output from the RF unit 111, based on a power supply voltage Vcc supplied from the power supply circuit 112 to a level required for transmission to the base station and outputs an amplified signal (RFout).

The front end unit 114 carries out filtering of the amplified signal (RFout), switching to and from a reception signal received from the base station, and so on. An amplified signal output from the front end unit 114 is transmitted to the base station via the antenna 115.

Figure 2:
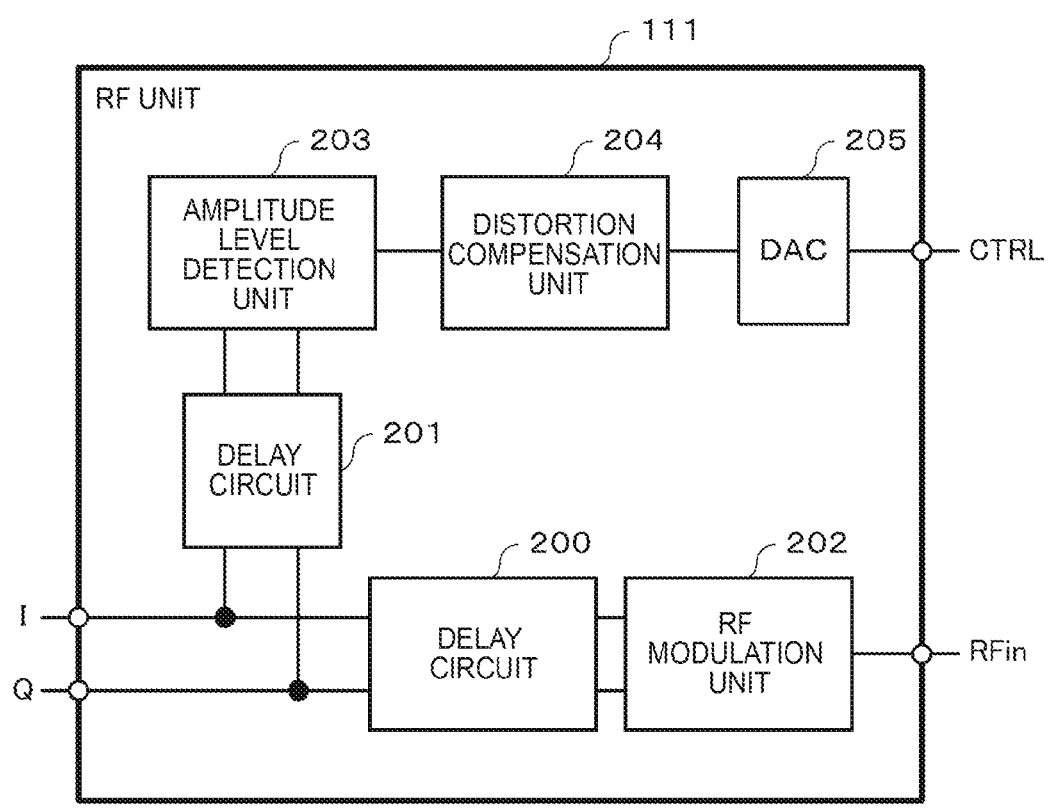
FIG. 2 is a diagram showing an example of a configuration of an RF unit.

FIG. 2 is a diagram showing an example of a configuration of the RF unit 111. As shown in FIG. 2, the RF unit 111 includes delay circuits 200 and 201, an RF modulation unit 202, an amplitude level detection unit 203, a distortion compensation unit 204, and a digital-to-analog converter (DAC) 205.

The delay circuits 200 and 201 are circuits each configured to delay an IQ signal by a predetermined time so that a timing at which an RF signal is input to the power amplifying module 113 and a timing at which a power supply voltage Vcc corresponding to an amplitude level of the RF signal is supplied to the power amplifying module 113 agree with each other.

The RF modulation unit 202 produces an RF signal from an IQ signal and outputs it to the power amplifying module 113. Specifically, for example, the RF modulation unit 202 combines an I signal and a carrier signal using a multiplier to produce a combined signal, combines a Q signal and a carrier signal with a phase shift of 90 degrees using a multiplier to produce a combined signal, and combines these combined signals using a subtractor, thereby obtaining an RF signal.

The amplitude level detection unit 203 detects an amplitude level of a modulated signal based on an IQ signal. The amplitude level thus detected corresponds to an amplitude level of an RF signal that is output from the RF modulation unit 202.

The distortion compensation unit 204 adjusts a level of a power supply voltage Vcc so as to prevent an occurrence of amplitude distortion in an amplified signal when performing envelope tracking. Gain characteristics of a transistor used in the power amplifying module 113 may vary due to a power supply voltage Vcc. Therefore, in order to maintain the linearity of the power amplifying module 113, the power supply voltage Vcc should be controlled to keep the gain constant. For example, the distortion compensation unit 204 can store a table indicating a correspondence relationship between an amplitude level of a modulated signal and a level of a power supply voltage Vcc on the basis of the gain characteristics of the transistor. Based on this table, the distortion compensation unit 204 can output a power supply control signal adapted to control a power supply voltage Vcc to a level corresponding to an amplitude level of a modulated signal.

The DAC 205 converts the power supply control signal, output from the distortion compensation unit 204, into an analog signal and outputs it to the power supply circuit 112.

Figure 3:
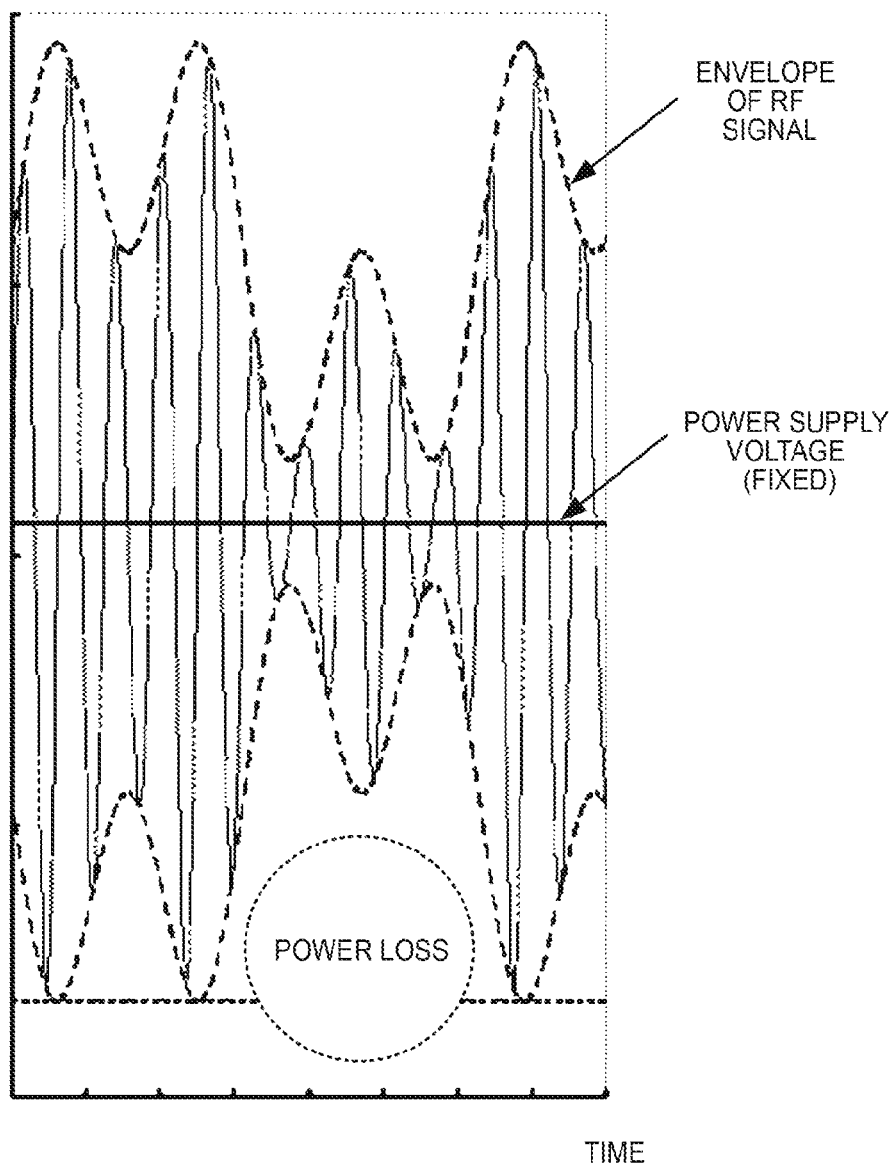
FIG. 3 is a diagram showing an example of power loss when power amplification is performed using a fixed power supply voltage.
Figure 4:
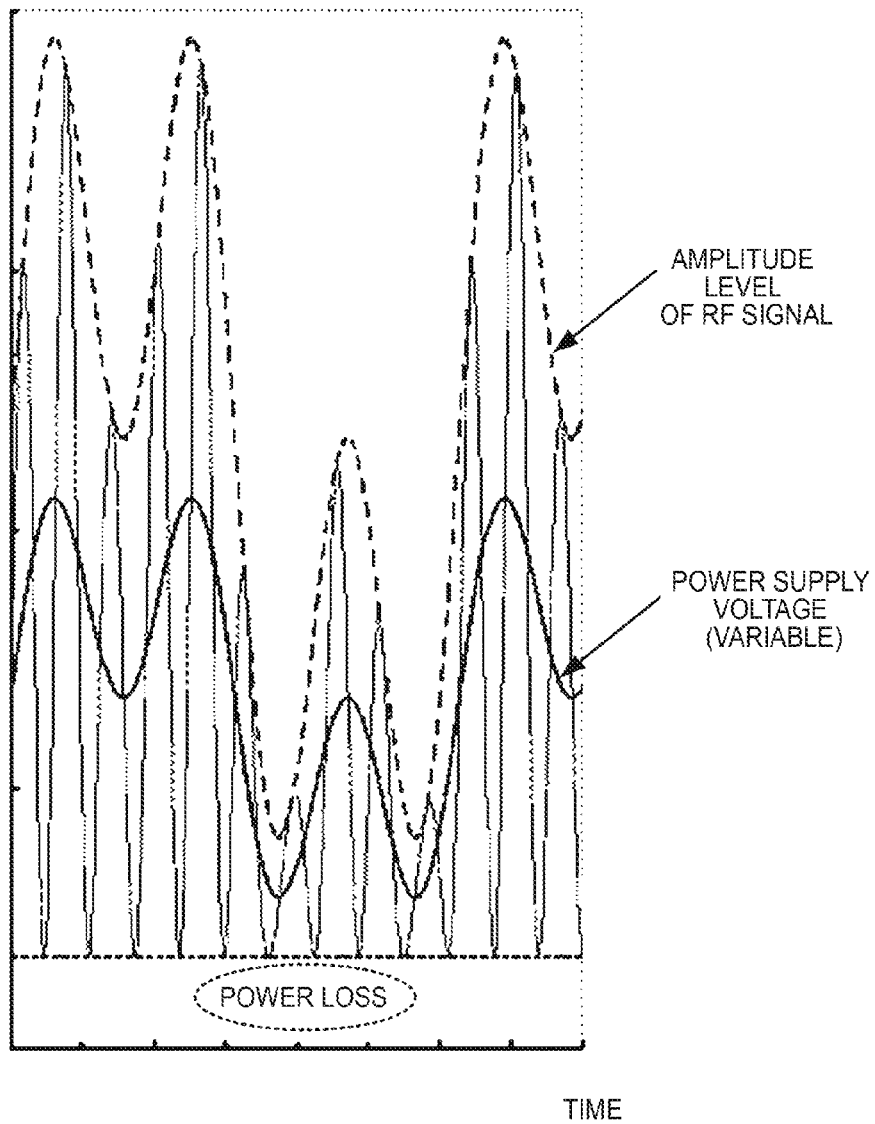
FIG. 4 is a diagram showing an example of power loss when power amplification is performed using a variable power supply voltage by envelope tracking.

Referring to FIGS. 3 and 4, an example of power supply voltage control by envelope tracking will be described. FIG. 3 shows an example of power loss when power amplification is performed using a fixed power supply voltage. As shown in FIG. 3, when the amplitude level of an RF signal largely changes, using a fixed power supply voltage set for a maximum amplitude level of the RF signal causes a large power loss in a period in which the amplitude level of the RF signal is small.

FIG. 4 shows an example of power loss when power amplification is performed using a variable power supply voltage by envelope tracking. As shown in FIG. 4, a power loss can be reduced by changing a power supply voltage in accordance with an amplitude level of an RF signal.

In this preferred embodiment, based on a power supply control signal output from the RF unit 111, the power supply circuit 112 controls a power supply voltage Vcc, which is supplied to the power amplifying module 113, to a level corresponding to an amplitude level of an RF signal.

Figure 5:
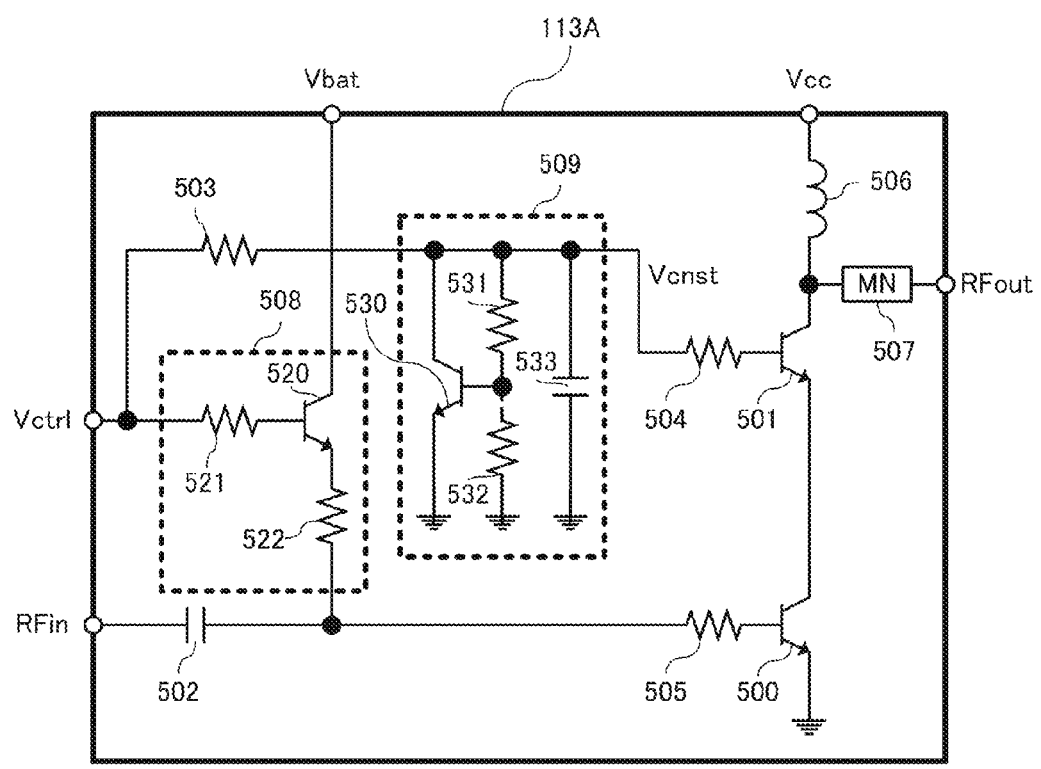
FIG. 5 is a diagram showing an example of a configuration of a power amplifying module.

FIG. 5 is a diagram showing an example of a configuration of the power amplifying module 113. As shown in FIG. 5, a power amplifying module 113A includes transistors 500 and 501, a capacitor 502, resistors 503 to 505, an inductor 506, a matching network (MN) 507, a bias circuit 508, and a constant voltage circuit 509. Transistors forming the power amplifying module 113A are bipolar transistors. For example, each transistor can be a heterojunction bipolar transistor (HBT) of a compound semiconductor such as GaAs. This also applies to later-described other configurations.

An RF signal (RFin) (first radio frequency signal) is input to a base of the transistor 500 (first bipolar transistor) via the capacitor 502 and the resistor 505. The transistor 500 is connected at its collector to an emitter of the transistor 501 and is grounded at its emitter.

A constant voltage Vcnst (first constant voltage) is applied to a base of the transistor 501 (second bipolar transistor) via the resistor 504. A power supply voltage Vcc (first power supply voltage) is applied to a collector of the transistor 501 via the inductor 506. The emitter of the transistor 501 is connected to the collector of the transistor 500.

The bias circuit 508 is a circuit configured to supply a bias voltage to the transistor 500 and includes a transistor 520 and resistors 521 and 522. A control voltage Vctrl (first bias control voltage) for bias control is applied to a base of the transistor 520 (third bipolar transistor) via the resistor 521. A power supply voltage (e.g. a battery voltage Vbat) is applied to a collector of the transistor 520 and an emitter thereof is connected to the base of the transistor 500 via the resistor 522 and the resistor 505.

The constant voltage circuit 509 is a circuit configured to generate the constant voltage Vcnst (e.g. 1.8V) to be applied to the base of the transistor 501 and includes a transistor 530, resistors 531 and 532, and a capacitor 533. The control voltage Vctrl (e.g. 2.8V) is applied to a collector of the transistor 530 via the resistor 503. The transistor 530 is connected at its base to a connection point of the resistors 531 and 532 and is grounded at its emitter. The resistors 531 and 532 are connected in series to each other and have one end connected to the collector of the transistor 530 and the other end grounded. The capacitor 533 has one end connected to the collector of the transistor 530 and the other end grounded.

In the configuration shown in FIG. 5, the constant voltage circuit 509 generates the constant voltage Vcnst based on the control voltage Vctrl which is for bias control. However, the constant voltage Vcnst may be generated based on a power supply voltage different from the control voltage Vctrl. Alternatively, the constant voltage Vcnst may be supplied from the outside of the power amplifying module 113A.

In the power amplifying module 113A shown in FIG. 5, the transistors 500 and 501 form a cascode amplifier circuit. Herein, with respect to the transistor 501, since the base voltage is constant, the emitter voltage is a constant voltage lower than the base voltage by a threshold voltage. Therefore, the collector voltage of the transistor 500 is also constant.

With respect to the transistor 500, since the collector voltage is constant (AC-grounded), the voltage amplification gain of an RF signal (RFin) is zero. On the other hand, a current that flows through the transistor 500 depends on an RF signal (RFin). In other words, the transistor 500 operates as a variable current source that supplies a current corresponding to an RF signal (RFin).

Since the base voltage of the transistor 501 is constant (AC-grounded), the transistor 501 operates as a base-grounded amplifying circuit. Thus, an amplified signal (RFout) obtained by amplifying an RF signal (RFin) is output from the collector of the transistor 501 via the matching network 507.

As described above, the collector voltage of the transistor 500 is constant. In other words, the gain of the transistor 500 is constant regardless of a variation in power supply voltage Vcc. In addition, since the transistor 501 is the base-grounded amplifying circuit, a change in base-collector parasitic capacitance in accordance with a power supply voltage Vcc has only a small influence on the gain.

As described above, in the power amplifying module 113A, since the amplifier circuit is formed by the transistors 500 and 501 cascode-connected to each other, a gain variation in accordance with a power supply voltage Vcc can be suppressed compared to a case where a usual common-emitter amplifying circuit is used. Therefore, it is possible to improve the linearity of the power amplifying module 113A employing the envelope tracking scheme.

In the power amplifying module 113A, the number of fingers of the upper transistor 501 of the cascode amplifier circuit may be smaller than that of the lower transistor 500. In terms of the current capacity, the number of fingers of the upper transistor 501 is preferably equal to or greater than that of the lower transistor 500. On the other hand, in terms of suppressing gain variation, the number of fingers of the upper transistor 501 is preferably smaller than that of the lower transistor 500. However, if the number of fingers of the upper transistor 501 is excessively small, the current capacity becomes insufficient. In other words, the numbers of fingers of the transistors 500 and 501 can be determined in consideration of trade-off between the current capacity and the suppression of gain variation.

Figure 6:
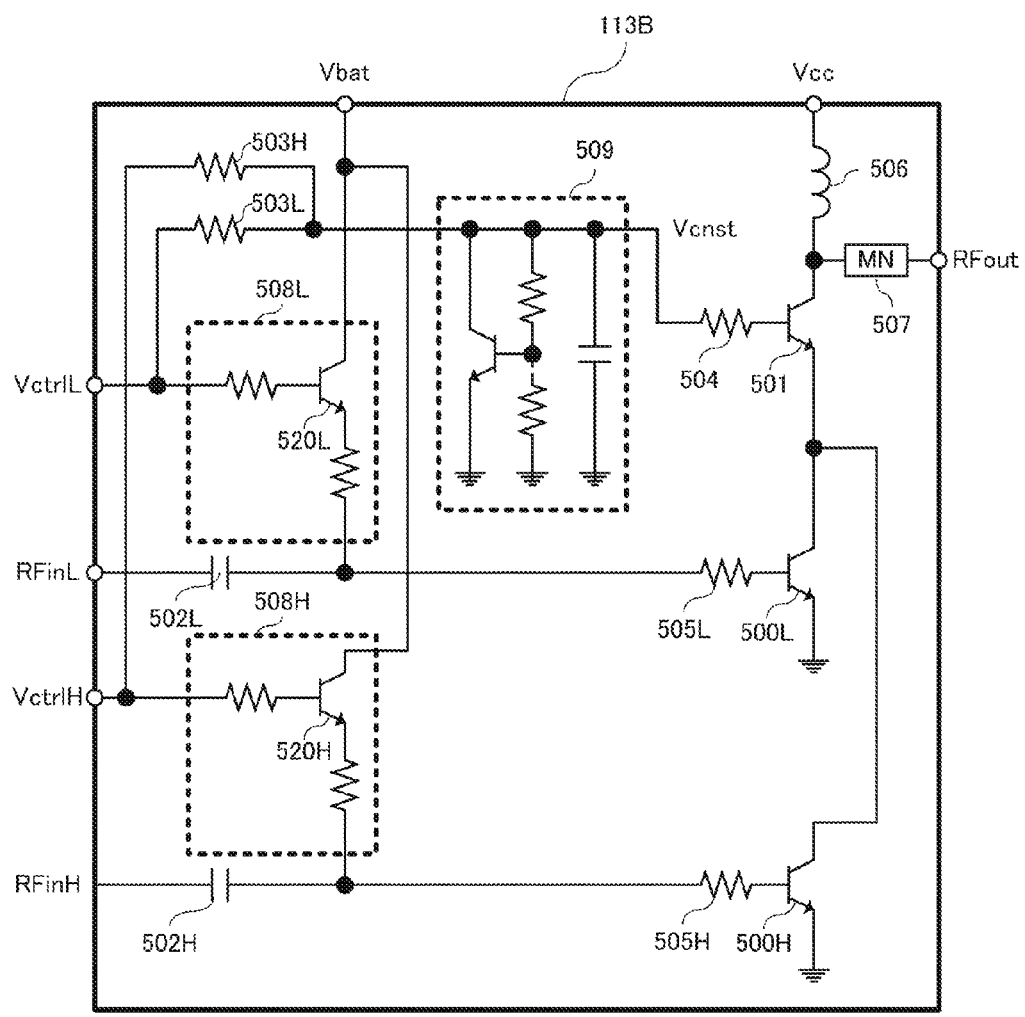
FIG. 6 is a diagram showing another example of a configuration of a power amplifying module.

FIG. 6 is a diagram showing another example of a configuration of the power amplifying module 113. The same or equivalent components as or to those in FIG. 5 are assigned the same or equivalent reference symbols and a description thereof will be omitted. A power amplifying module 113B is compatible with two frequency bands, i.e. a low frequency band and a high frequency band. In FIG. 6, "L" is added to the end of a reference symbol of a component for the low frequency band, while "H" is added to the end of a reference symbol of a component for the high frequency band. Although the number of frequency bands is two in the shown example, the number of frequency bands may be three or more.

As shown in FIG. 6, the power amplifying module 113B includes a transistor 500L and a bias circuit 508L for the low frequency band. Further, the power amplifying module 113B includes a transistor 500H and a bias circuit 508H for the high frequency band.

An RF signal (RFinL) (first radio frequency signal) in the low frequency band is input to a base of the transistor 500L (first bipolar transistor) for the low frequency band via a capacitor 502L and a resistor 505L. The transistor 500L is connected at its collector to an emitter of a transistor 501 (second bipolar transistor) and is grounded at its emitter. The bias circuit 508L for the low frequency band includes a transistor 520L (third bipolar transistor) and supplies a bias to the transistor 500L based on a control voltage VctrlL input from a control terminal (first control terminal) for the low frequency band.

An RF signal (RFinH) (second radio frequency signal) in the high frequency band is input to a base of the transistor 500H (fourth bipolar transistor) for the high frequency band via a capacitor 502H and a resistor 505H. The transistor 500H is connected at its collector to the emitter of the transistor 501 and is grounded at its emitter. The bias circuit 508H for the high frequency band includes a transistor 520H (fifth bipolar transistor) and supplies a bias to the transistor 500H based on a control voltage VctrlH input from a control terminal (second control terminal) for the high frequency band.

In the power amplifying module 113B, switching between an operation in a low frequency band mode and an operation in a high frequency band mode is carried out based on the control voltages VctrlL and VctrlH.

For example, when operating in the low frequency band mode, the control voltage VctrlL is set to a high level (e.g. 2.8V), while the control voltage VctrlH is set to a low level (e.g. 0V). In this case, the bias circuit 508L for the low frequency band operates, while the bias circuit 508H for the high frequency band does not operate. Further, a constant voltage circuit 509 generates a constant voltage Vcnst (e.g. 1.8V) based on the control voltage VctrlL. Thus, the cascode-connected transistors 500L and 501 operate as an amplifier circuit so that an amplified signal (RFout) obtained by amplifying an RF signal (RFinL) in the low frequency band is output from a collector of the transistor 501 via a matching network 507.

On the other hand, for example, when operating in the high frequency band mode, the control voltage VctrlL is set to a low level (e.g. 0V), while the control voltage VctrlH is set to a high level (e.g. 2.8V). In this case, the bias circuit 508L for the low frequency band does not operate, while the bias circuit 508H for the high frequency band operates. Further, the constant voltage circuit 509 generates a constant voltage Vcnst (e.g. 1.8V) based on the control voltage VctrlH. Thus, the cascode-connected transistors 500H and 501 operate as an amplifier circuit so that an amplified signal (RFout) obtained by amplifying an RF signal (RFinH) in the high frequency band is output from the collector of the transistor 501 via the matching network 507.

In the power amplifying module 113B, when operating in either mode, a gain variation in accordance with a power supply voltage Vcc is suppressed by the cascode amplifier circuit in the same manner as in the power amplifying module 113A shown in FIG. 5.

In addition, in the power amplifying module 113B, the operations of the bias circuits 508L and 508H are switched therebetween by the control voltages VctrlL and VctrlH so that the upper transistor 501 in cascode connection is shared by the transistors 500L and 500H. Therefore, the circuit size can be reduced compared to a case where upper transistors in cascode connection are provided separately for the low frequency band and the high frequency band. Although an example of a power amplifying module having a two-stage configuration is shown herein, a power amplifying module may have a configuration of three or more stages.

Figure 7:
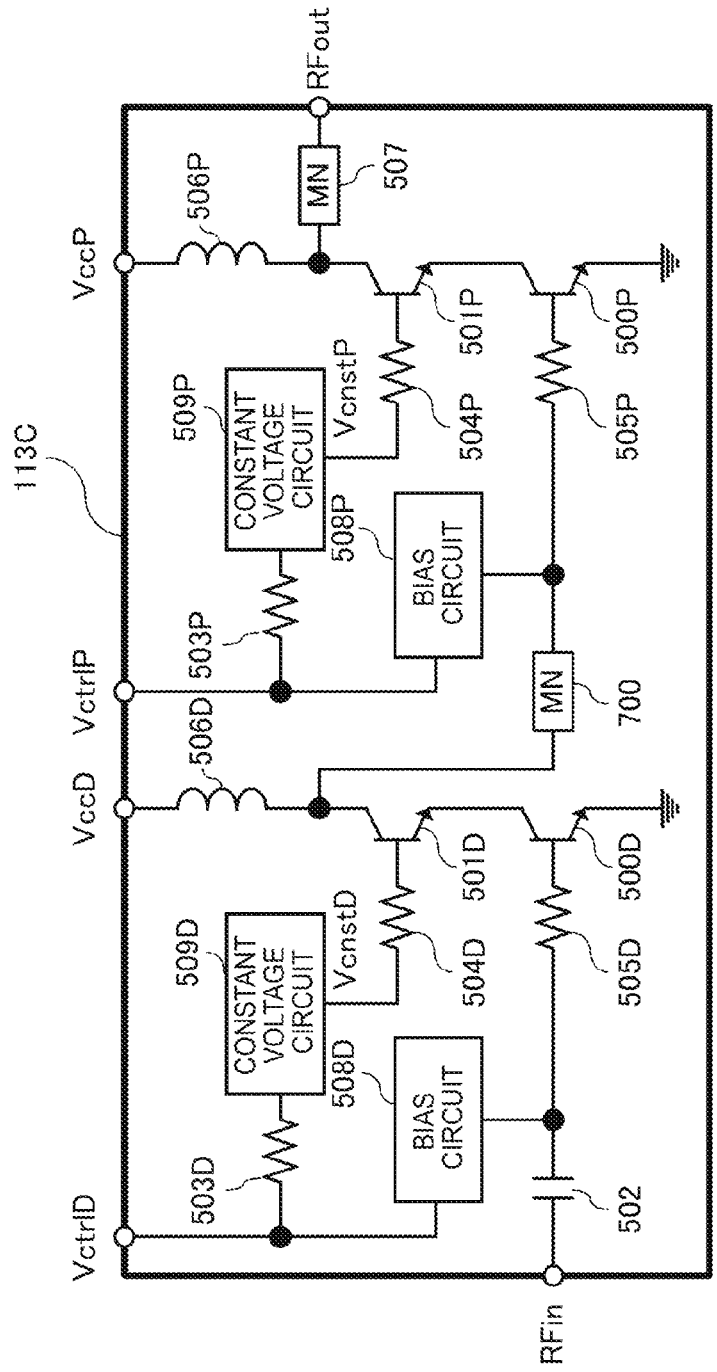
FIG. 7 is a diagram showing another example of a configuration of a power amplifying module.

FIG. 7 is a diagram showing another example of a configuration of the power amplifying module 113. The same or equivalent components as or to those in FIG. 5 are assigned the same or equivalent reference symbols and a description thereof will be omitted. A power amplifying module 113C has a two-stage configuration having a drive stage and a power stage. In FIG. 7, "D" is added to the end of a reference symbol of a component in the drive stage, while "P" is added to the end of a reference symbol of a component in the power stage.

In the drive stage of the power amplifying module 113C, a bias circuit 508D supplies a bias to a transistor 500D based on a control voltage VctrlD. Further, a constant voltage circuit 509D generates a constant voltage VcnstD (first constant voltage) based on the control voltage VctrlD (first control voltage). Then, based on an envelope-controlled power supply voltage VccD (first power supply voltage), the transistor 500D and a transistor 501D cascode-connected to each other output an amplified signal (first amplified signal), obtained by amplifying an RF signal (RFin), from a collector of the transistor 501D.

The amplified signal output from the drive stage of the power amplifying module 113C is input to the power stage thereof via a matching network 700. In the power stage of the power amplifying module 113C, a bias circuit 508P supplies a bias to a transistor 500P based on a control voltage VctrlP (second control voltage). Further, a constant voltage circuit 509P generates a constant voltage VcnstP (second constant voltage) based on the control voltage VctrlP. Then, based on an envelope-controlled power supply voltage VccP (second power supply voltage), the transistor 500P (sixth bipolar transistor) and a transistor 501P (seventh bipolar transistor) cascode-connected to each other output an amplified signal (RFout) (second amplified signal), obtained by amplifying the signal input from the drive stage, from a collector of the transistor 501P via a matching network 507.

In this manner, even in the power amplifying module 113C of the two-stage configuration, a gain variation in accordance with each of power supply voltages VccD and VccP is suppressed by the cascode amplifier circuit in the same manner as in the power amplifying module 113A shown in FIG. 5.

In the power amplifying module 113C, the constant voltage circuits are provided separately in the drive stage and the power stage. However, the drive stage and the power stage may share a single constant voltage circuit. Alternatively, a constant voltage may be supplied from the outside of the power amplifying module 113C.

In the power amplifying module 113C, both the drive stage and the power stage are envelope-controlled. However, only one of the drive stage and the power stage may be envelope-controlled.

Figure 8:
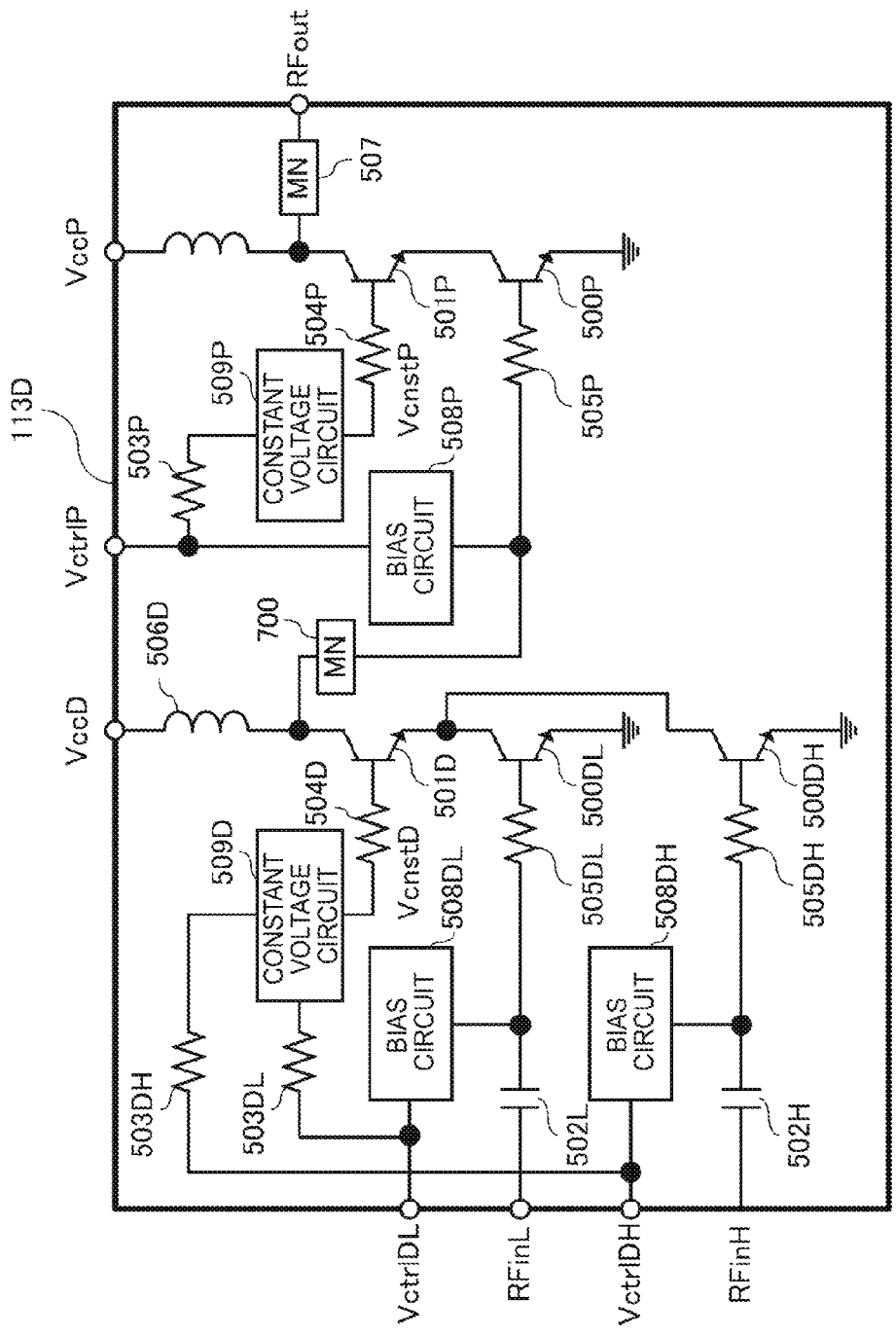
FIG. 8 is a diagram showing another example of a configuration of a power amplifying module.

FIG. 8 is a diagram showing another example of a configuration of the power amplifying module 113. The same or equivalent components as or to those in FIG. 6 or 7 are assigned the same or equivalent reference symbols and a description thereof will be omitted.

A power amplifying module 113D is configured such that the drive stage in the power amplifying module 113C shown in FIG. 7 has a configuration equivalent to the power amplifying module 113B shown in FIG. 6. In FIG. 8, "D" is added to the end of a reference symbol of a component in a drive stage, while "P" is added to the end of a reference symbol of a component in a power stage. Further, "L" is added to the end of a reference symbol of a component for a low frequency band, while "H" is added to the end of a reference symbol of a component for a high frequency band. Although an example of a power amplifying module having a two-stage configuration is shown herein, a power amplifying module may have a configuration of three or more stages.

As shown in FIG. 8, when the drive stage is configured to be compatible with the low frequency band and the high frequency band, an amplifier circuit in the power stage can be shared for the low frequency band and the high frequency band. Therefore, the circuit size can be reduced compared to a case where amplifier circuits are provided separately for the low frequency band and the high frequency band in the power stage.

Figure 9A:
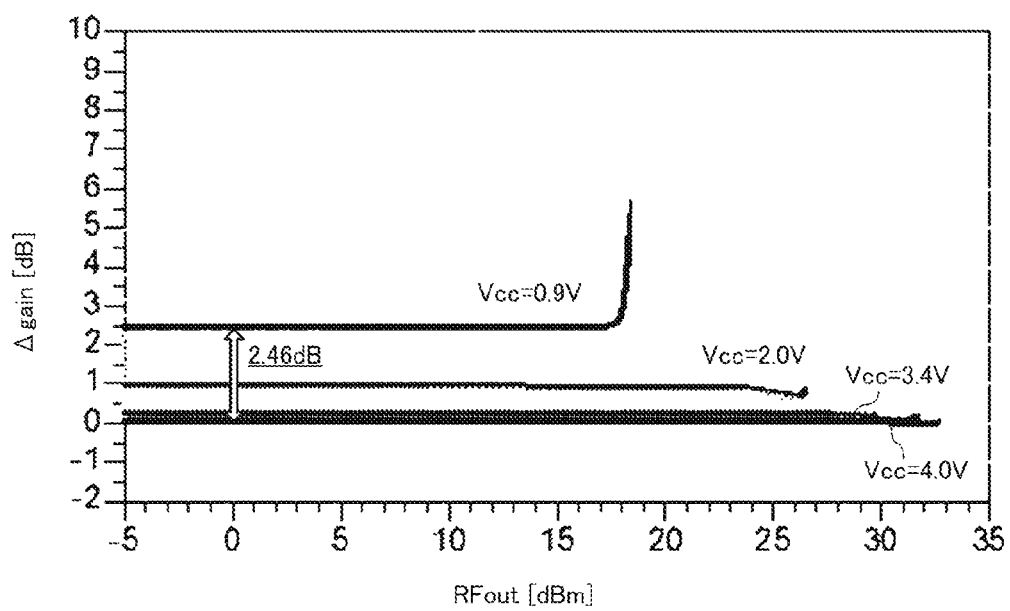
FIG. 9A is a diagram showing simulation results of gain variation in a usual power amplifying module.

FIG. 9A is a diagram showing simulation results of gain variation in a usual power amplifying module. Specifically, FIG. 9A shows simulation results of gain variation in the drive stage in a low frequency band mode in the case where a usual common-emitter amplifying circuit is used for a cascode amplifier circuit in the power amplifying module 113D shown in FIG. 8.

Figure 9B:
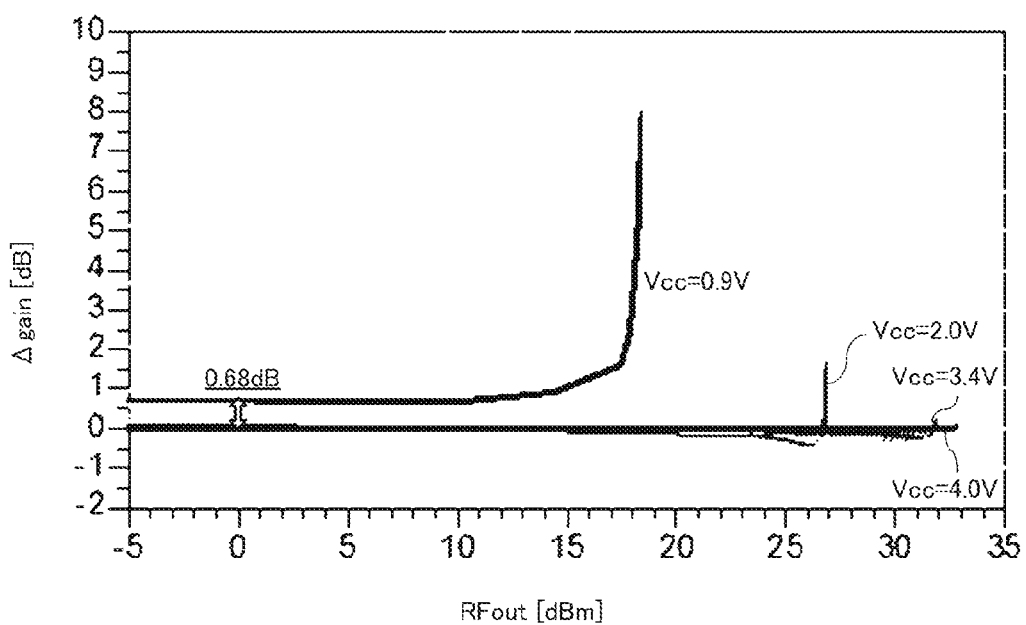
FIG. 9B is a diagram showing simulation results of gain variation in the power amplifying module shown in FIG. 8.

FIG. 9B is a diagram showing simulation results of gain variation in the power amplifying module shown in FIG. 8. Specifically, FIG. 9B shows simulation results of gain variation in the drive stage in a low frequency band mode in the power amplifying module 113D shown in FIG. 8.

In FIGS. 9A and 9B, the abscissa axis represents a level (dBm) of an amplified signal (RFout) and the ordinate axis represents a difference (dB) from a gain obtained when the power supply voltage Vcc is 4.0V. As shown in FIG. 9A, in the usual configuration, a gain variation when the power supply voltage Vcc is changed in a range from 0.9V to 4.0V is about 2.46 dB. On the other hand, as shown in FIG. 9B, in the power amplifying module 113D, a gain variation when the power supply voltage Vcc is changed in a range from 0.9V to 4.0V is about 0.68 dB. These simulation results reveal that a gain variation in accordance with a power supply voltage Vcc is suppressed by the use of the cascode amplifier circuit as described in this preferred embodiment.

Preferred embodiments of the present invention have been described. According to preferred embodiments of the present invention, since an amplifier circuit is formed by transistors cascode-connected to each other, a gain variation in accordance with a power supply voltage Vcc can be suppressed compared to a case where a usual common-emitter amplifying circuit is used. Therefore, it is possible to improve the linearity of a power amplifying module employing an envelope tracking scheme.

In addition, according to preferred embodiments of the present invention, for example, as shown in FIG. 6, an upper transistor in cascode connection can be shared for a plurality of frequency bands. Thus, the circuit size of a power amplifying module can be reduced.

Preferred embodiments of the present invention are intended to facilitate understanding of the present invention and are not intended for limited interpretation of the present invention. The present invention can be changed or improved without departing from the spirit thereof and includes equivalents thereof.

DESCRIPTION OF REFERENCE SYMBOLS

100: transmission unit
110: baseband unit
111: RF unit
112: power supply circuit
113: power amplifying module
114: front end unit
115: antenna
200, 201: delay circuit
202: RF modulation unit
203: amplitude level detection unit
204: distortion compensation unit
205: DAC
500, 501, 520, 530: transistor
502, 533: capacitor 503 to 505, 521, 522, 531, 532: resistor
506: inductor
507, 700: matching network
508: bias circuit
509: constant voltage circuit

What is claimed is:

1. A power amplifying module comprising:
a first bipolar transistor having a base to which a first radio frequency signal is input and an emitter grounded; and
a second bipolar transistor having a base to which a first constant voltage is applied, a collector to which a first power supply voltage is applied, the first power supply voltage adapted to vary in accordance with an amplitude of the first radio frequency signal, and an emitter connected to a collector of the first bipolar transistor, the second bipolar transistor configured to output a first amplified signal, obtained by amplifying the first radio frequency signal, from the collector of the second bipolar transistor;
a third bipolar transistor connected in an emitter-follower connection manner to the base of the first bipolar transistor and configured to supply a bias to the first bipolar transistor based on a first bias control voltage applied to a base of the third bipolar transistor; and
a constant voltage circuit configured to generate the first constant voltage based on the first bias control voltage.

2. The power amplifying module according to claim 1, further comprising:
a fourth bipolar transistor having a base to which a second radio frequency signal is input and an emitter grounded,
wherein the first power supply voltage adapted to vary in accordance with an amplitude of the first or second radio frequency signal selectively input is input to the collector of the second bipolar transistor, wherein the emitter of the second bipolar transistor is connected to the collector of the first bipolar transistor and to a collector of the fourth bipolar transistor, and wherein the second bipolar transistor is configured to output the first amplified signal, obtained by amplifying the first or second radio frequency signal, from the collector of the second bipolar transistor.

3. The power amplifying module according to claim 2, further comprising:
a third bipolar transistor connected in an emitter-follower connection manner to the base of the first bipolar transistor and configured to supply a bias to the first bipolar transistor based on a first bias control voltage applied to a base of the third bipolar transistor;
a fifth bipolar transistor connected in an emitter-follower connection manner to the base of the fourth bipolar transistor and configured to supply a bias to the fourth bipolar transistor based on a second bias control voltage applied to a base of the fifth bipolar transistor; and
a constant voltage circuit configured to generate the first constant voltage based on the first or second bias control voltage.

4. The power amplifying module according to claim 3, further comprising:
a first control terminal to which the first bias control voltage is input, the first control terminal connected to the base of the third bipolar transistor and to the constant voltage circuit; and
a second control terminal to which the second bias control voltage is input, the second control terminal connected to the base of the fifth bipolar transistor and to the constant voltage circuit.

5. The power amplifying module according to claim 1, further comprising:
a sixth bipolar transistor having a base to which the first amplified signal is input and an emitter grounded; and
a seventh bipolar transistor having a base to which a second constant voltage is applied, a collector to which a second power supply voltage is applied, the second power supply voltage adapted to vary in accordance with the amplitude of the first radio frequency signal, and an emitter connected to a collector of the sixth bipolar transistor, the seventh bipolar transistor configured to output a second amplified signal, obtained by amplifying the first amplified signal, from the collector of the seventh bipolar transistor.

6. The power amplifying module according to claim 1, further comprising:
a sixth bipolar transistor having a base to which the first amplified signal is input and an emitter grounded; and
a seventh bipolar transistor having a base to which a second constant voltage is applied, a collector to which a second power supply voltage is applied, the second power supply voltage adapted to vary in accordance with the amplitude of the first radio frequency signal, and an emitter connected to a collector of the sixth bipolar transistor, the seventh bipolar transistor configured to output a second amplified signal, obtained by amplifying the first amplified signal, from the collector of the seventh bipolar transistor.

7. The power amplifying module according to claim 2, further comprising:
a sixth bipolar transistor having a base to which the first amplified signal is input and an emitter grounded; and
a seventh bipolar transistor having a base to which a second constant voltage is applied, a collector to which a second power supply voltage is applied, the second power supply voltage adapted to vary in accordance with the amplitude of the first radio frequency signal or the second radio frequency signal, and an emitter connected to a collector of the sixth bipolar transistor, the seventh bipolar transistor configured to output a second amplified signal, obtained by amplifying the first amplified signal, from the collector of the seventh bipolar transistor.

8. The power amplifying module according to claim 3, further comprising:
a sixth bipolar transistor having a base to which the first amplified signal is input and an emitter grounded; and
a seventh bipolar transistor having a base to which a second constant voltage is applied, a collector to which a second power supply voltage is applied, the second power supply voltage adapted to vary in accordance with the amplitude of the first radio frequency signal or the second radio frequency signal, and an emitter connected to a collector of the sixth bipolar transistor, the seventh bipolar transistor configured to output a second amplified signal, obtained by amplifying the first amplified signal, from the collector of the seventh bipolar transistor.

9. The power amplifying module according to claim 4, further comprising:
a sixth bipolar transistor having a base to which the first amplified signal is input and an emitter grounded; and
a seventh bipolar transistor having a base to which a second constant voltage is applied, a collector to which a second power supply voltage is applied, the second power supply voltage adapted to vary in accordance with the amplitude of the first radio frequency signal or the second radio frequency signal, and an emitter connected to a collector of the sixth bipolar transistor, the seventh bipolar transistor configured to output a second amplified signal, obtained by amplifying the first amplified signal, from the collector of the seventh bipolar transistor.

* * * * *